United States Patent
Rosen et al.

[11] Patent Number: 5,536,954
[45] Date of Patent: Jul. 16, 1996

[54] OPTICALLY COUPLED MESFET

[75] Inventors: Arye Rosen, Cherry Hill; Arthur C. Paolella, Howell, both of N.J.; Peter R. Herczfeld, Philadelphia, Pa.; Joseph H. Abeles, Highland Park, N.J.

[73] Assignee: The United States of America as represented by the Secretary of the Army, Washington, D.C.

[21] Appl. No.: 292,153

[22] Filed: Aug. 17, 1994

[51] Int. Cl.$^6$ ................................................. H01L 27/14
[52] U.S. Cl. ........................ 257/187; 257/257; 257/462; 385/37
[58] Field of Search ................................. 257/290, 187, 257/459, 462, 252, 256, 257; 385/37

[56] References Cited

U.S. PATENT DOCUMENTS 5,298,739  3/1994  Hiroki et al. ........................... 257/290
5,347,601  9/1994  Ade et al. ................................. 385/3

Primary Examiner—Donald L. Monin, Jr.
Attorney, Agent, or Firm—Michael Zelenka; William H. Anderson

[57] ABSTRACT

An optically coupled FET comprised of bottom layer, a top layer in which the FET is formed and an intermediate layer having a waveguide communicating with a grating in registration with the FET.

7 Claims, 2 Drawing Sheets

OPTICALLY COUPLED MESFET

GOVERNMENT INTEREST

The invention described herein may be manufactured, used, and licensed by or for the Government of the United States of America without the payment to us of any royalty thereon.

FIELD OF INVENTION

This invention relates in general to an optically coupled MESFET.

BACKGROUND OF THE INVENTION

The availability of optical fiber for relatively loss-free and environmentally stable transmission and distribution have created much interest in optical control of microwave signals for commercial applications such as cable television (CATV) signal distribution, high definition television (HDTV), communications and phased-array radar. Since the MESFET dominates GaAs MMIC technology, exploring its properties for use as an optical detector is important, particularly if the emphasis is on monolithic integration of optical and microwave components. TO efficiently introduce optical signals into the active regions of FET's for photo-detection is important. However, optical coupling via the top of the MESFET is poor due to the shadowing of the optical signal by the gate, drain and source metal contacts.

As is known to those skilled in the art, a FET is comprised of a substrate on which an epitaxial layer is grown and parallel, spaced, metal source, gate and drain electrodes that are deposited on the top of the epitaxial layer. In order for light to influence the operation of the FET, it must be introduced into what is known as the active region that is largely in the portion of the epitaxial layer lying between the source and drain electrodes. If light is directed toward the active region through the substrate, it is largely absorbed by the substrate, and if it is directed toward the active region from the other side, it is largely blocked by the gate electrode. In fact, only 5% of the region is reached in the latter case.

SUMMARY OF THE INVENTION

In accordance with this invention as much as 50% of the active region can be illuminated with light so as to substantially increase the photocurrent and thereby improve the dynamic range and increase the signal to noise ratio. This is achieved by the formation of a grating in an additional layer between the substrate and the portion of the epitaxial layer in which the active region of the FET resides and by introducing light into the end of a waveguide formed in the additional layer. Light passing through the waveguide is directed into the active region by the grating. Light is not shaded from the active region by the gate electrode because it enters the FET from the other side i.e. from the substrate side rather than the side on which the electrodes are deposited. In fabrication, the alignment of the optics and the gate is controlled by photolithography.

A further advantage of the invention is that the side on which the electrodes are deposited is left free for critical high bandwidth mounting of microstrip band wires.

BRIEF DESCRIPTION OF THE DRAWINGS

Various embodiments of the invention are described below with reference to the drawings, in which like items are indicated by the same reference designation, wherein.

DETAILED DESCRIPTION OF THE INVENTION

Figure 1:
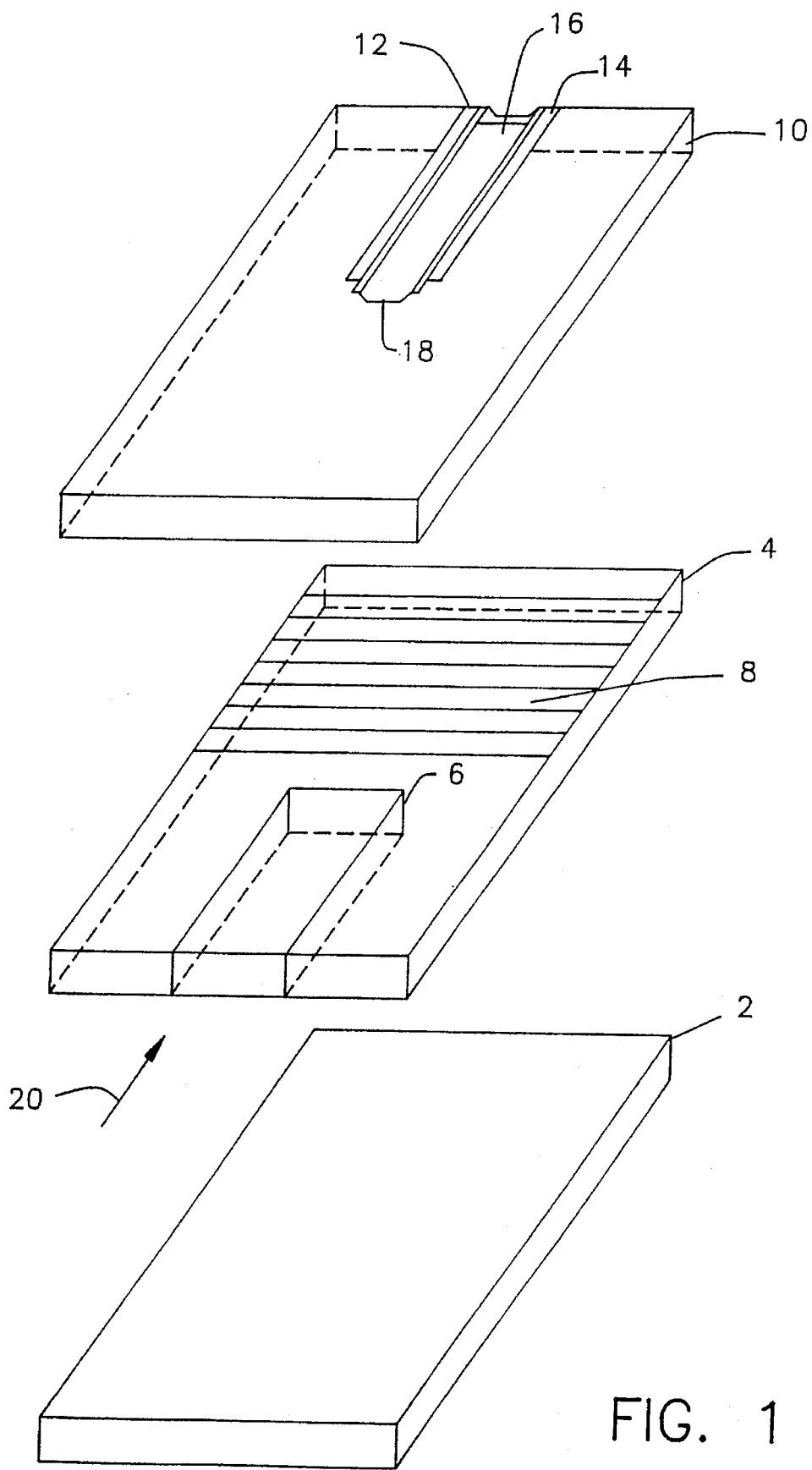
FIG. 1 is an exploded view of an optically coupled FET of the invention.
Figure 2:
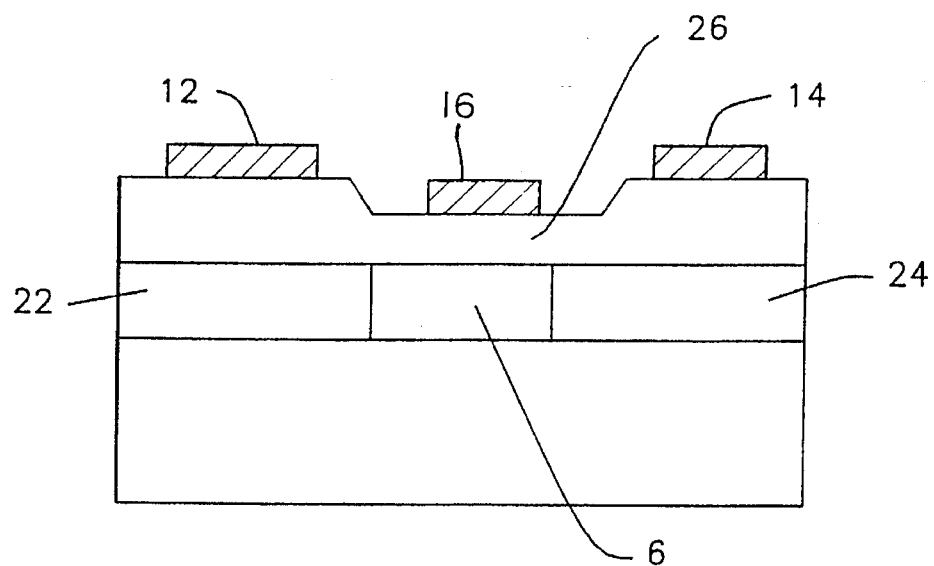
FIG. 2 is an end view of an optically coupled FET of the invention taken transversely of the electrodes.

In the exploded view of FIG. 1 there is a substrate layer 2, an additional layer 4 containing a waveguide 6 and a grating 8 and a device layer 10 having source and drain electrodes 12 and 14 on either side of and parallel to a gate electrode 16. The gate electrode 16 is in the bottom of a trough 18 formed in the top surface of the device layer 10. The structure of the device layer 10 is more clearly seen in the end view of FIG. 2.

The waveguide 6 in the additional layer 4 is comprised of material having a coefficient of refraction greater than the material around it so that light introduced at one end, as indicated by an arrow 20, is reflected back into the waveguide wherever it impinges on an internal surface thereof at an angle less than the critical angle. By way of example, the waveguide layer 6 could be made of GaAs and the substrate layer 2 and device layer 10 could be made of AlGaAs so as to prevent light from escaping from the guide in a direction transverse to the layers, and the portions of the waveguide layer 4 adjacent the waveguide 6 could be treated so as to have impurity induced layer disordering, IILD, thus preventing light from escaping from the guide in a lateral direction. The sections of the layer 4 that have IILD are indicated at 22 and 24 in the end view of FIG. 3. It is not necessary that the IILD occupy an entire section.

Figure 3:
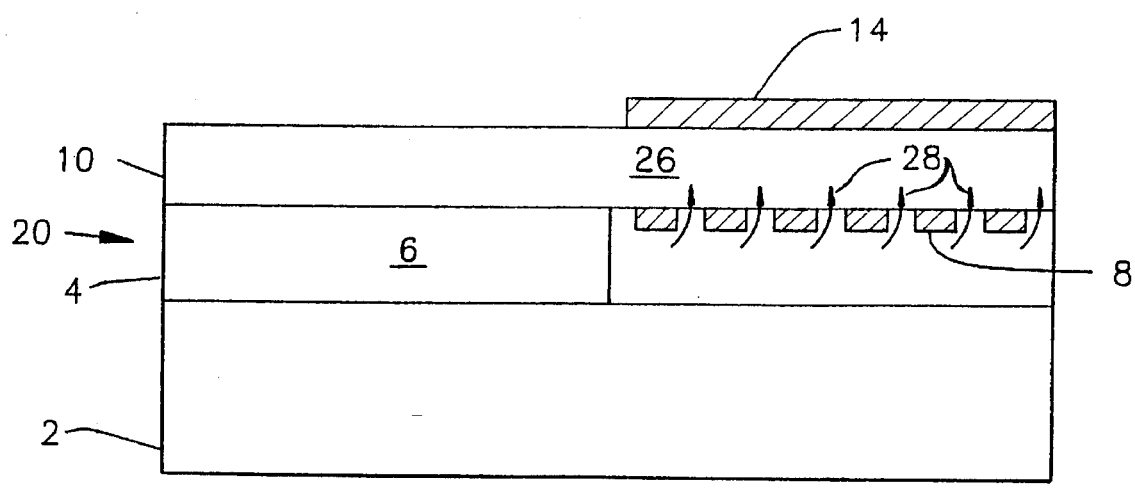
FIG. 3 is a side view of a FET of this invention taken parallel to the electrodes.

The grating 8 deflects light emerging from the waveguide 6 upwardly into the active region 26 between the source and drain electrodes 12 and 14 as shown in FIG. 3 by and arrows 28. By entering the device layer 10 through a surface that is opposite to that on which the electrodes 12, 14, and 16 of the FET are deposited, more light reaches the active layer 26 of the FET because it is not blocked by the gate 16.

The grating 8 can be formed by scoring lines in the top of the additional waveguide layer 4 at least within an area that is in registration with the area occupied by the electrodes 12, 14, and 16, but this may cause imperfect planarization of the subsequently grown device layer 10. Therefore, it is preferable that the grating 8 be formed by impurity induced layer disordering, IILD, at least within an area in registration with the area occupied by the electrodes. However the grating is formed, it is easier to make if it extends across the entire surface of the layer 4.

Another way of conducting light from the waveguide to the active region 26 of the FET 12, 14, and 16 is to employ evanescent coupling, but this has the disadvantage of requiring optical parameters that may be difficult to attain such as the necessity of locating the waveguide layers in close proximity (~2000Å) to the MESFET active layer 26. In this type of coupling, the light escapes from the waveguide as it travels along it.

In the device as described, the top and bottom layers 2 and 10 are said to be made of AlGaAs, and the middle layer 4 is said to be made of GaAs, but it is not necessary that the portions of the layers in the region of the device 12, 16, 14 and in the region occupied by the waveguide 6 be the same, but it would be easier to manufacture the device if they were. The materials GaAs and AlGaAs are suggested because AlGaAs is generally used in high frequency devices. Nor is it necessary that the region occupied by the waveguide 8 be made of GaAs and AlGaAs.

In order to confine the light laterally in the middle layer 4 to the region below the active region of the FET 12, 16, 14, the adjacent areas could be processed so as to exhibit IILD, or they could be made of material exhibiting a different coefficient of refraction.

Although the grating 8 could be oriented differently with respect to the electrodes 12, 16, and 14 of the FET, it is more efficient if they are perpendicular thereto as shown.

Although various embodiments of the invention have been shown and described herein, they are not meant to be limiting. Those of skill in the art may recognize certain modifications to these embodiments, which modifications are meant to be covered by the spirit and scope of the appended claims.

What is claimed is:

1. An optically coupled FET comprising:

first, second and third layers;

means forming a waveguide in said second layer;

means forming the source, drain and gate electrodes of a FET on the surface of said third layer that is remote from said second layer, said FET having an active region; and means in said second layer for coupling light from said waveguide to said active region of said FET wherein:
   said means for coupling light from said waveguide to said active region of said FET is a grating.

2. An optically coupled FET as set forth in claim 1 wherein:

said means forming a waveguide is comprised of materials surrounding it having a lower coefficient of refraction than the material in it.

3. An optically coupled FET comprising:

first, second and third layers;

means forming a waveguide in said second layer;

means forming the source drain and gate electrodes of a FET on the surface of said third layer that is remote from said second layer, said FET having an active region; and means in said second layer for coupling light from said waveguide to said active region of said FET wherein:
   said waveguide is formed of GaAs;
   said first and third layers are formed of AlGaAs;
   the portions of said second layer that are adjacent said waveguide are treated so as to have impurity induced layer disordering; and
   said means for coupling light from said waveguide to said active region of said FET is a grating.

4. An optically coupled FET as set forth in claim 3 wherein:

said grating is formed of impurity induced layer disordering.

5. An optically coupled FET as set forth in claim 4 wherein:

said grating is formed by scored lines.

6. An optically coupled FET comprising:

a first layer that serves as a substrate;

a second layer on said first layer;

a third layer on said second layer;

source, drain and gate electrodes formed on the side of said third layer that is remote from said second layer;

a grating formed in said second layer at least in an area in registration with said source, drain and gate electrodes;

a waveguide formed in said Second layer in an area laterally displaced from said electrodes and communicating with said grating; and said waveguide being formed by said second layer being comprised of material having a higher coefficient of refraction than said first and third layers and at least the portions of said second layer that are adjacent said waveguide being treated so as to have impurity induced layer disordering.

7. An optically coupled FET as set forth in claim 6 wherein:

said first and third layers are made of AlGaAs and said second layer is made of GaAs.

* * * * *